(12) United States Patent
Eilmsteiner et al.

(10) Patent No.: US 12,727,261 B2
(45) Date of Patent: Sep. 1, 2026

(54) ON-CHIP INTEGRATION OF INDIUM TIN OXIDE (ITO) LAYERS FOR OHMIC CONTACT TO BOND PADS

(71) Applicant: ams AG, Premstaetten (AT)

(72) Inventors: Gerhard Eilmsteiner, Eindhoven (NL); Hannes Brandner, Eindhoven (NL); Patrik Pertl, Eindhoven (NL)

(73) Assignee: ams AG, Premstaetten (AT)

( * ) Notice: Subject to any disclaimer, the term of this patent is extended or adjusted under 35 U.S.C. 154(b) by 592 days.

(21) Appl. No.: 17/601,914

(22) PCT Filed: Apr. 4, 2020

(86) PCT No.: PCT/EP2020/059697
§ 371 (c)(1),
(2) Date: Oct. 6, 2021

(87) PCT Pub. No.: WO2020/207935
PCT Pub. Date: Oct. 15, 2020

(65) Prior Publication Data

US 2022/0216244 A1 Jul. 7, 2022

Related U.S. Application Data

(60) Provisional application No. 62/831,289, filed on Apr. 9, 2019.

(51) Int. Cl.
*H10W 72/90* (2026.01)
*H10F 39/10* (2025.01)
*H10W 72/00* (2026.01)

(52) U.S. Cl.
CPC ......... *H10F 39/103* (2025.01); *H10W 72/019* (2026.01); *H10W 72/90* (2026.01);
(Continued)

(58) Field of Classification Search
CPC ..... H01L 2224/0382–05686; H01L 24/03–05; H01L 27/1443
(Continued)

(56) References Cited

U.S. PATENT DOCUMENTS 9,134,527 B2 * 9/2015 Lee ...................... G02B 26/001
2006/0046411 A1 * 3/2006 Takeda ................ H10D 10/821
257/E29.189
(Continued)

FOREIGN PATENT DOCUMENTS

CN 1993648 B 6/2011
CN 107783690 A 3/2018
(Continued)

OTHER PUBLICATIONS

Taiwanese office action issued for the corresponding TW patent application 109112001, dated May 30, 2024, 7 pages (for informational purposes only).
(Continued)

*Primary Examiner* — Michael G Lee
(74) *Attorney, Agent, or Firm* — Viering, Jentschura & Partner mbB

(57) ABSTRACT

An apparatus includes an optical device (22) and an electrically conductive bond pad (32). A multi-layer stack (42, 44,46) of electrically conductive materials is disposed on the bond pad (32). An ITO layer (48) is disposed at least partially on the optical device (22) and makes ohmic contact with the multi-layer stack (42,44,46).

10 Claims, 5 Drawing Sheets

(52) U.S. Cl.
CPC ........ *H10W 72/923* (2026.01); *H10W 72/942* (2026.01); *H10W 72/952* (2026.01); *H10W 72/953* (2026.01)

(58) Field of Classification Search
USPC .......................................................... 257/749
See application file for complete search history.

(56) References Cited

U.S. PATENT DOCUMENTS

| | | | | |
|---|---|---|---|---|
| 2006/0063351 | A1* | 3/2006 | Jain | G02F 1/1368 438/455 |
| 2006/0073692 | A1 | 4/2006 | Yoshida | |
| 2008/0210957 | A1 | 9/2008 | Watanabe et al. | |
| 2008/0265759 | A1 | 10/2008 | Young et al. | |
| 2009/0284821 | A1 | 11/2009 | Valentin et al. | |
| 2010/0117523 | A1 | 5/2010 | Tchakarov | |
| 2010/0246152 | A1* | 9/2010 | Lin | H01L 23/481 361/783 |
| 2011/0233558 | A1 | 9/2011 | Lee | |
| 2013/0240923 | A1 | 9/2013 | Hsu | |
| 2013/0284889 | A1 | 10/2013 | Giffard et al. | |
| 2015/0144870 | A1 | 5/2015 | An | |
| 2016/0020422 | A1 | 1/2016 | Kim | |

FOREIGN PATENT DOCUMENTS

| | | | |
|---|---|---|---|
| CN | 108206198 | A | 6/2018 |
| KR | 1020140128633 | A | 6/2014 |
| TW | 200739958 | A | 10/2007 |
| TW | 201212281 | A | 3/2012 |
| WO | 2008119899 | A2 | 10/2008 |

OTHER PUBLICATIONS

CN Office Action, dated Jul. 27, 2023, pp. 1-22.

DE Office Action, dated Jul. 6, 2023, pp. 1-18.

International Search Report and Written Opinion dated Jul. 29, 2020 for corresponding International Application No. PCT/EP2020/059697.

* cited by examiner

ON-CHIP INTEGRATION OF INDIUM TIN OXIDE (ITO) LAYERS FOR OHMIC CONTACT TO BOND PADS

RELATED APPLICATIONS

The present invention is a U.S. National Stage under 35 USC 371 patent application, claiming priority to Serial No. PCT/EP2020/059697, filed on 4 Apr. 2020; which claims priority from U.S. Provisional Application No. 62/831,289 filed 9 Apr. 2019, the entirety of both of which are incorporated herein by reference.

FIELD OF THE DISCLOSURE

The present disclosure relates to indium tin oxide (ITO) layers for ohmic contact to complementary metal-oxide-semiconductor (CMOS) bond pads.

BACKGROUND

Indium tin oxide (ITO) can be transparent in the visible spectrum and also can be electrically conductive. Such properties make ITO suitable for many optoelectronic applications. Investigations also have been made into the use of an ITO thin film layer for connection to a metallic electrode such as aluminum (e.g., a CMOS bond pad, metal bus or data lines). Unfortunately, the contact formation between ITO and aluminum can be impaired by oxidation of the interface. Oxidation can occur, for example, when the interface is exposed to air. The interface oxidation also can be caused by oxygen fed, for example, into the sputtering process during reactive sputtering of ITO, oxygen radicals or oxygen release of the ITO sputter target itself. Even if the formation of a thin oxide layer can be avoided by modifying the ITO sputter process, the contact resistance tends to remain unacceptably high and increases over time with thermal stress. This phenomenon is based on the diffusion of oxygen atoms from the ITO thin film into the aluminum, thus creating an insulating oxide layer that leads to the high contact resistivity.

SUMMARY

The present disclosure describes on-chip integration of ITO thin films for ohmic contacts to CMOS or other electrically conductive bond pads.

For example, in one aspect, the present disclosure describes an apparatus that includes an optical device. The apparatus further includes an electrically conductive bond pad, and a multi-layer stack of electrically conductive materials on the bond pad, wherein the stack includes a first ITO layer as a top layer. A second ITO layer is disposed at least partially on the optical device and on the first ITO layer.

Some implementations include one or more of the following features. For example, the multi-layer stack of electrically conductive materials can include a conductive layer in direct contact with the bond pad, and a sub-stack of at least one diffusion barrier layer or adhesion layer in direct contact with the conductive layer, wherein the first ITO layer is in direct contact with the sub-stack of at least one diffusion barrier layer or adhesion layer. The multi-layer stack of electrically conductive materials can form an ohmic contact to the bond pad. As a specific example, the multi-layer stack can include a titanium layer on an aluminum layer that is in direct contact with the bond pad, wherein the first ITO layer is on the titanium layer. Other materials may be used in some implementations.

In some instances, the first ITO layer has a composition that differs from that of the second ITO layer. In some cases, the second ITO layer covers the optical device. For example, the optical device can be an optical interference filter disposed over a light detecting element in an integrated semiconductor circuit.

In some implementations, the optical device is a photodetector (e.g., an organic infrared photodetector) covered by the second ITO layer. The apparatus further includes, in some cases, a second electrically conductive bond pad; a second multi-layer stack of different electrically conductive materials on the second electrically conductive bond pad, the second stack including a top layer comprising a first ITO layer; and an electrode layer disposed on a side of the optical device opposite that of the second ITO layer and connected to the first ITO layer of the second stack. In some instances, the electrode layer disposed on a side of the optical device opposite that of the second ITO layer is composed of a third ITO layer.

The foregoing features can be integrated, for example, as part of a CMOS integrated circuit.

The present disclosure also describes methods for manufacturing devices that include ITO thin films for ohmic contacts to CMOS or other electrically conductive bond pads. Thus, in one aspect, a method includes providing a substrate that includes an electrically conductive bond pad, wherein an optical device is disposed on the substrate. The method includes providing a multi-level stack of electrically conductive materials on the bond pad, the stack including a first ITO layer as a top layer, and providing a second ITO layer at least partially on the optical device and the first ITO layer.

The present disclosure further describes a method that includes providing a substrate that includes first and second electrically conductive bond pads; providing a first multi-level stack of electrically conductive materials on the first bond pad and providing a second multi-level stack of electrically conductive materials on the second bond pad, each of the stacks including a respective first ITO layer as a top layer; providing a second ITO layer on the substrate and connected to the first ITO layer of the first multi-level stack; providing an optical device on the second ITO layer; and providing a third ITO layer at least partially on the optical device and connected to the first ITO layer of the second multi-level stack.

Each of the multi-level stacks can include a conductive layer on the respective bond pad, a sub-stack of at least one adhesion layer or barrier layer on the conductive layer, and the first ITO layer on the sub-stack.

In some cases, the first ITO layer can be omitted. For example, the multi-layer stack of electrically conductive materials on the bond pad can include a sub-stack of at least one diffusion barrier layer or adhesion layer in direct contact with the bond pad, and a conductive layer in direct contact with the sub-stack. The ITO layer that is disposed at least partially on the optical device is in electrical contact with the multi-layer stack. In some instances, the layers of the multi-layer stack extend along a surface of a substrate in which the conductive bond pad is disposed, and a portion of the ITO layer underlies part of the multi-layer stack.

The present disclosure can help overcome the problem of an oxide interface layer between a metal, such as aluminum, and ITO, which tends to have detrimental effects on the contact resistance. The manufacturing methods can be based on standard CMOS technologies for layer deposition and structuring. Thus, in some cases, the ITO layer(s) can be integrated into a CMOS device as an add-on without the need to provide the ITO electrical connections as part of a separate sub-assembly. In particular, a reliable contact of thin ITO layers can be made to CMOS bond pads, thereby allowing the electro-optical functionality of ITO to be integrated on CMOS wafers. The techniques can help ensure reliable contacts to CMOS bond pads and can optimize optical performance of the ITO layers and/or provide electrostatic or RF shielding for an optical device.

Other aspects, features and advantages will be readily apparent from the following detailed description, the accompanying drawings, and the claims.

DETAILED DESCRIPTION

The present disclosure describes the on-chip integration of ITO thin films for ohmic contacts to CMOS or other electrically conductive bond pads. As described in greater detail below, the present techniques use an ITO-to-ITO contact to avoid problems that otherwise can occur as a result of the formation of an oxide interlayer.

Figure 1:
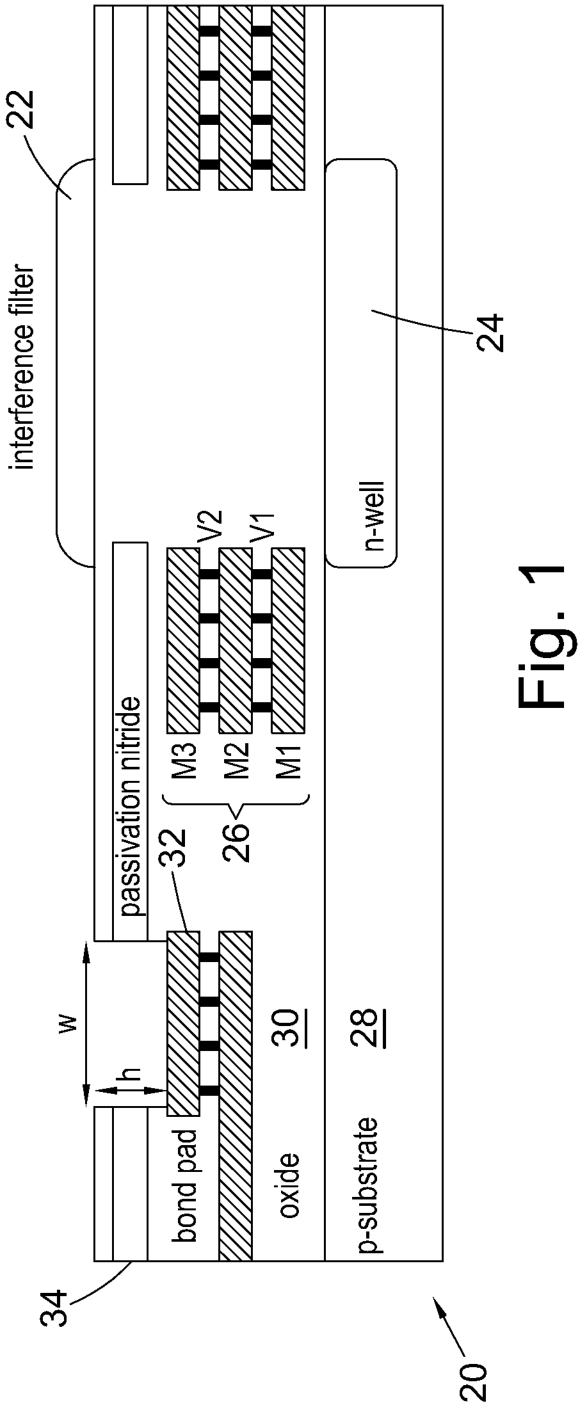
FIGS. 1-3 illustrate various steps in a first example process of on-chip integration of ITO thin films for an ohmic contact to a bond pad.
Figure 2:
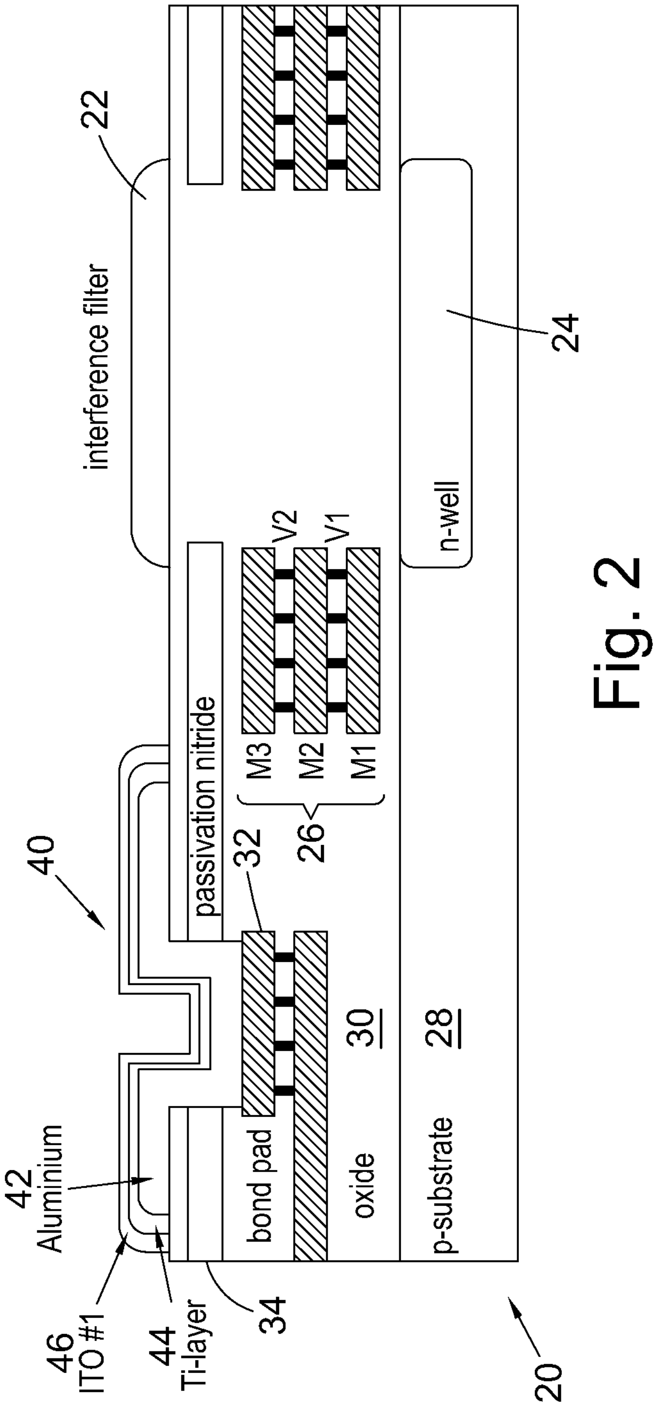
Figure 3:
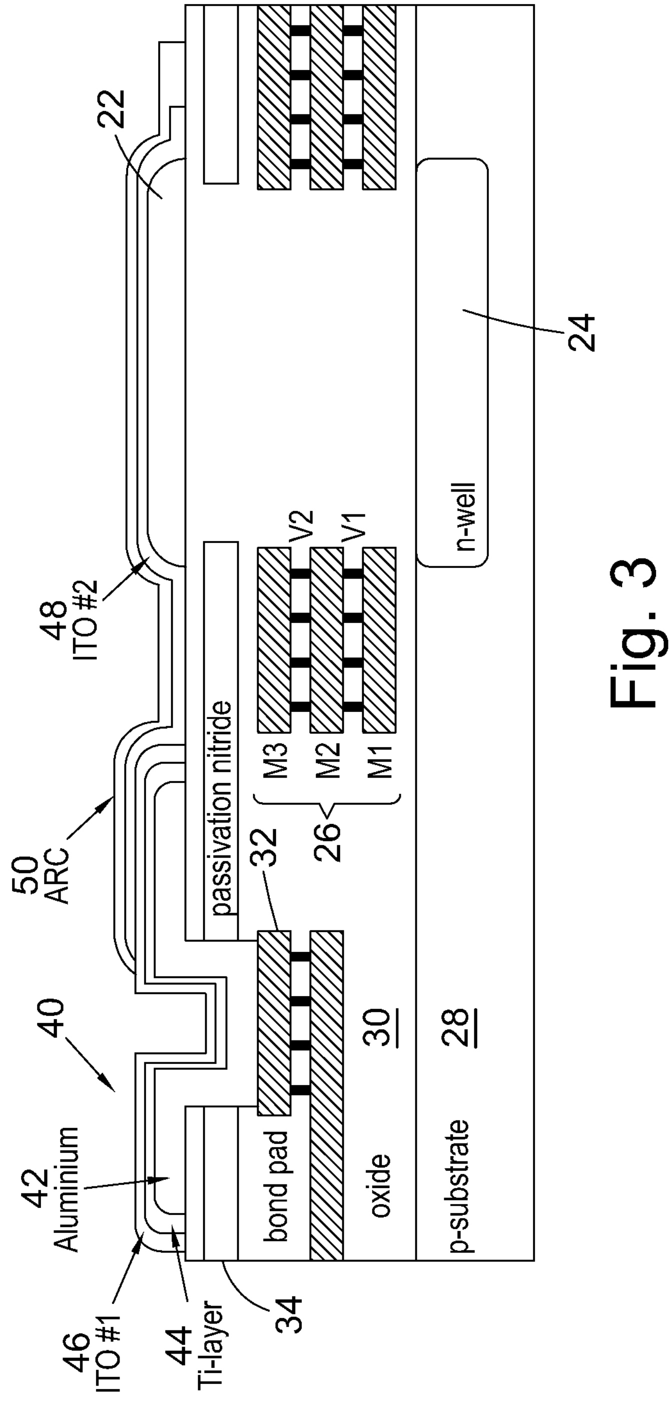

An example is described in connection with FIGS. 1-3, which illustrate a substrate 20, such as a CMOS semiconductor wafer, having an interference filter 22 on top of an n-well photodiode 24. The interference filter is an optical filter that reflects one or more spectral bands or lines and transmits others so that they pass to the photodiode 24 where they can be detected. FIGS. 1-3 also show a backend stack that includes a multi-level metal structure 26 and corresponding conductive via levels. The multi-level metal structure can be composed, for example, of aluminum (Al) or some other conductive metal. In the illustrated example, the wafer 20 includes a p-type substrate 28 in which the n-well photodiode 24 is disposed. A dielectric layer (e.g., oxide) 30 is disposed on the substrate 28 and surrounds the multi-level metal stack 26. A portion of the backend stack forms a bond pad 32. In some instances, other types of substrates (e.g., glass) can be used instead of a semiconductor wafer.

Depending on the spectral characteristic of the filter 22, the arrangement can be used for various kinds of optical sensing purposes. For some applications, it is beneficial to provide a conductive shielding layer over the interference filter 22. A conductive shielding layer over the interference filter 22 may be formed, for example, by providing a transparent conductive material that is electrically coupled to the bond pad 32. ITO can provide a suitable material for this purpose because it can be both transparent in the visible spectrum and electrically conductive. In some applications, the thickness of the ITO layer preferably is in the range of 30 nm to 300 nm to achieve to achieve desirable optical and electrical characteristics. The bond pad 32 can be used to apply a well-defined voltage to the ITO layer. However, depositing the ITO layer directly on to the bond pad 32 and performing a subsequent lift-off process for patterning the ITO can be difficult for at least two reasons. First, as mentioned above, a reliable low-ohmic contact cannot be achieved simply by depositing ITO onto aluminum because of the chemical properties of these materials, resulting in formation of a thin oxide layer. Second, as shown in FIG. 1, for a typical CMOS manufacturing process, there will be a step "h" of about 2 μm from the passivation surface 34 down to the bond pad 32. Accordingly, the step height "h" exceeds the ITO layer thickness by about one or two orders of magnitude. Thus, the formation of a reliable ITO contact directly to the bond pad 32 is very challenging, if not virtually impossible, in view of the step coverage issues.

To address the foregoing issues, the present disclosure describes a method including the formation of two different ITO layers that electrically couple the bond pad to the interference filter, so as to form at least part of an electrode for the filter. A first one of the ITO layers forms a top layer of a layered stack on the bond pad. The second ITO layer electrically extends over the interference filter and contacts the first ITO layer. Details of the method according to some implementations are described in connection with FIGS. 2 and 3.

As shown in the example of FIG. 2, a layered stack 40 of electrically conductive materials is deposited in a sequential manner on the bond pad 32 such that the materials are not exposed to air. Each of the layers in the stack 40 should form a good ohmic contact to the underlying layer on which it is deposited. In the illustrated example, the first layer 42 is composed of aluminum and has a thickness in a range of 0.5 μm-3 μm. This layer thickness helps ensure that the step coverage down to the bond pad 32 is sufficient to provide a good ohmic contact. Although aluminum is a preferred material because it is compatible with existing CMOS technology, other conductive materials (e.g., gold, silver, chromium and/or copper) can be used for the first layer 42 in some implementations.

Subsequently, without exposing the first layer 42 to air, a sub-stack of at least one diffusion barrier layer or adhesion layer 44 is deposited on the first layer 42. The at least one diffusion barrier layer or adhesion layer 44 can be composed, for example, of titanium (Ti). In some implementations, the at least one diffusion barrier layer or adhesion layer 44 includes cobalt, chromium, nickel-chromium, a nickel chromium alloy, molybdenum, and/or titanium suboxide. The thickness of this second layer 44 can be adjusted so as to maintain a good diffusion barrier to the subsequently deposited third layer material 46.

The third layer 46 is an ITO layer that provides electrical functionality, but need not provide any particular optical functionality. Therefore, the process parameters can be set such that the properties of the ITO layer 46 are optimized for low contact resistance to the underlying diffusion barrier layer 44. Preferably, the deposition technique (e.g., sputtering) should ensure that there is no significant oxidation of the sub-stack of at least one barrier layer or adhesion layer (e.g., the Ti layer 44) prior to the ITO deposition.

The three layers 42, 44, 46 in the stack 40 can exhibit and provide different electrical functionalities. Thus, for example, in some implementations, the relatively thick aluminum layer 42 ensures there is sufficient step coverage and low resistance. The Ti layer 44 can act as a diffusion barrier between the aluminum layer 42 and the ITO layer 46 to ensure reliable and low contact resistivity. The ITO layer 46 can exhibit low resistivity and also can act as a cap layer. As the ITO material for the layer 46 already is in an oxidized state, it is not prone to further oxidation. By providing the ITO layer 46 as an oxidized, but conductive, cap layer, subsequent process steps will not harm the surface of the ITO layer 46 by further oxidation.

After depositing the layers 42, 44, 46 for the stack 40, the stack is patterned (e.g., structured), for example, by a lift-off or other technique to ensure that the perimeter is free of fences or other lift-off artefacts that adversely may affect reliability.

Next, a second ITO layer 48 is deposited and patterned (e.g., structured), for example, by a lift-off technique. The second ITO layer 48 covers the interference filter 32 that is over the photodiode 24, as well as part of the three-layer-stack 40. Formation of a non-conductive oxide layer does not present a problem because the contact formation takes place between the first ITO layer 46 (which already is oxidized) and the second ITO layer 48. The second ITO layer 48 can provide both optical and electrical functionality and, therefore, may have a composition different from that of the first ITO layer 46. Thus, in addition to providing an electrical connection to the bond pad 32 via the stack 40 so as to provide electrostatic or RF shielding for the optical filter 22, the ITO layer 48 also can have specified optical properties (e.g., transparency in a particular part of the visible spectrum) to allow electromagnetic radiation in the visible range to pass to the filter 32 for detection by the photodiode 24.

In some instances, the ITO layer 48 is covered with a single- or multilayer anti-reflection coating (ARC) 50 to reduce reflection losses. The ARC 50 also can act as a protective layer for the underlying ITO layer 48 against humidity and oxidation.

Figure 4:
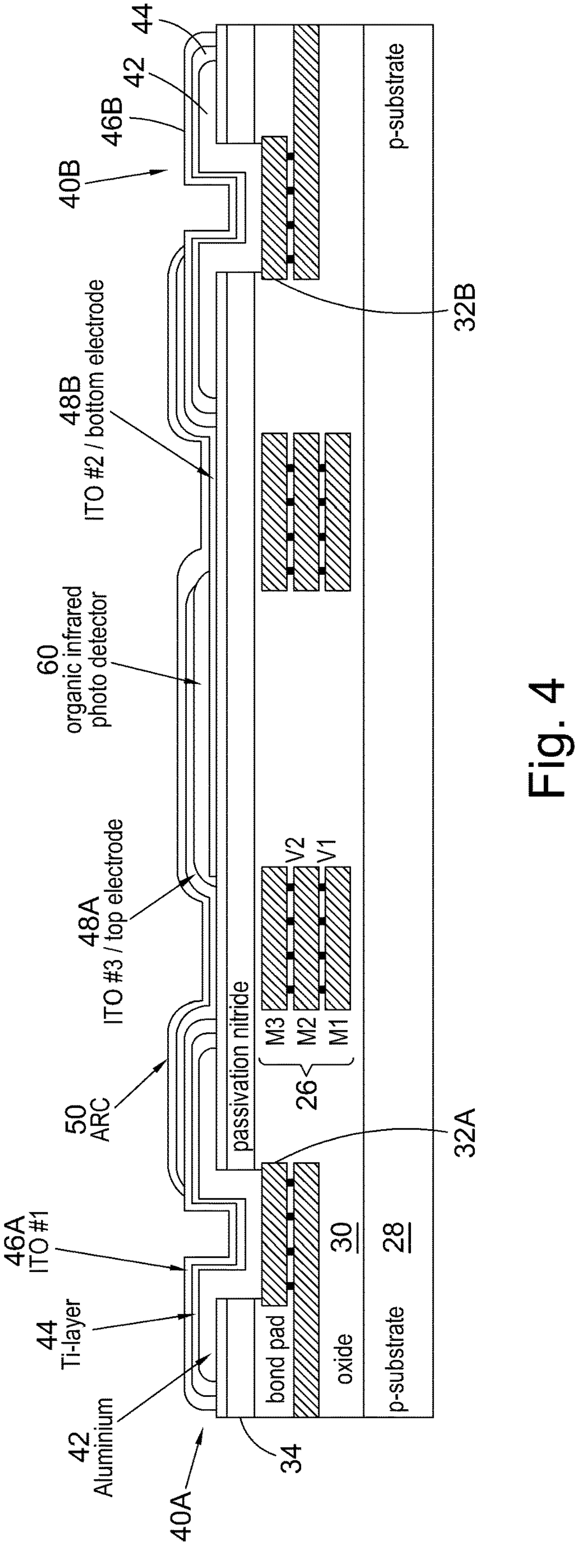
FIG. 4 illustrates another example of on-chip integration of ITO thin films for ohmic contacts to bond pads.

Similar techniques can be used for other types of opto-electronic devices as well. For example, thin ITO layers can be integrated on a CMOS wafer to provide top and bottom electrodes for an infra-red (IR) sensor. FIG. 4 illustrates an example that includes an IR sensitive organic layer 60 that serves as an organic photodetector for sensing light in the IR range. The device also includes top and bottom electrodes each of which is coupled electrically to a respective CMOS bond pad 32A, 32B by a respective stack 40A, 40B on the bond pads. The electrodes allow the optoelectronic properties of the sensor to be modified by adjusting the applied voltage.

Respective stacks 40A, 40B can deposited, in the manner described above, on each of the bond pads 32A, 32B. Each stack 40A, 40B includes a respective first ITO layer 46A, 46B on at least one diffusion barrier layer or adhesion layer 44 that is on a conductive layer 42. As noted above, the conductive layers 42 can be composed, e.g., of aluminum, gold, silver, chromium and/or copper. The at least one diffusion barrier layer or adhesion layer 44 in each stack 40A, 40B can include, e.g., of titanium, cobalt, chromium, nickel-chromium, a nickel chromium alloy, molybdenum, and/or titanium sub-oxide.

Next, a second ITO layer 48B, which serves as the bottom electrode, is deposited. Then, the IR sensitive organic layer 60 that serves as the organic photodetector is deposited, followed by deposition of a third ITO layer 48A that serves as the top electrode. Both ITO layers 48A, 48B that serve, respectively, as the top and bottom electrodes are connected to the respective bond pads 40A, 40B by the previously deposited multi-layer stack 40A, 40B. In some instances, an ARC layer 50 is deposited to encapsulate the ITO layers 48A, 48B and improve optical performance.

As explained in connection with the example of FIGS. 2 and 3, the ITO layers 46A, 46B that form part of the multi-layer stacks 40A, 40B on the bond pads 32A, 32B do not need to have any particular optical characteristics. Instead, they can be tailored to optimize their electrical characteristics. On the other hand, the ITO layers 48A, 48B that serve as the top and bottom electrodes, can be optimized for the desired optical characteristics as well. Thus, the ITO layers 48A, 48B may have a composition that differs from that of the ITO layers 46A, 46B. Further, the compositions of the ITO layers 48A, 48B may differ from one another.

The top electrode 48A should have a relatively low absorption for infrared light and a relatively low contact resistance to the detector material 60. The bottom electrode 48B should not be transparent for IR light, but should have a relatively low contact resistance to the detector material 60. Although an ITO layer is thus suitable for the bottom electrode 48B, in some cases, a noble metal that does not form a native oxide at the interface with the detector material 60 can be used instead.

By varying the voltage signal applied to the bond pads 32A, 32B the voltage applied to the interference filter 32 can be varied so as to so to achieve particular optical filtering characteristics and, thereby, impact the wavelength(s) of light sensed by the photodiode 24.

Figure 5:
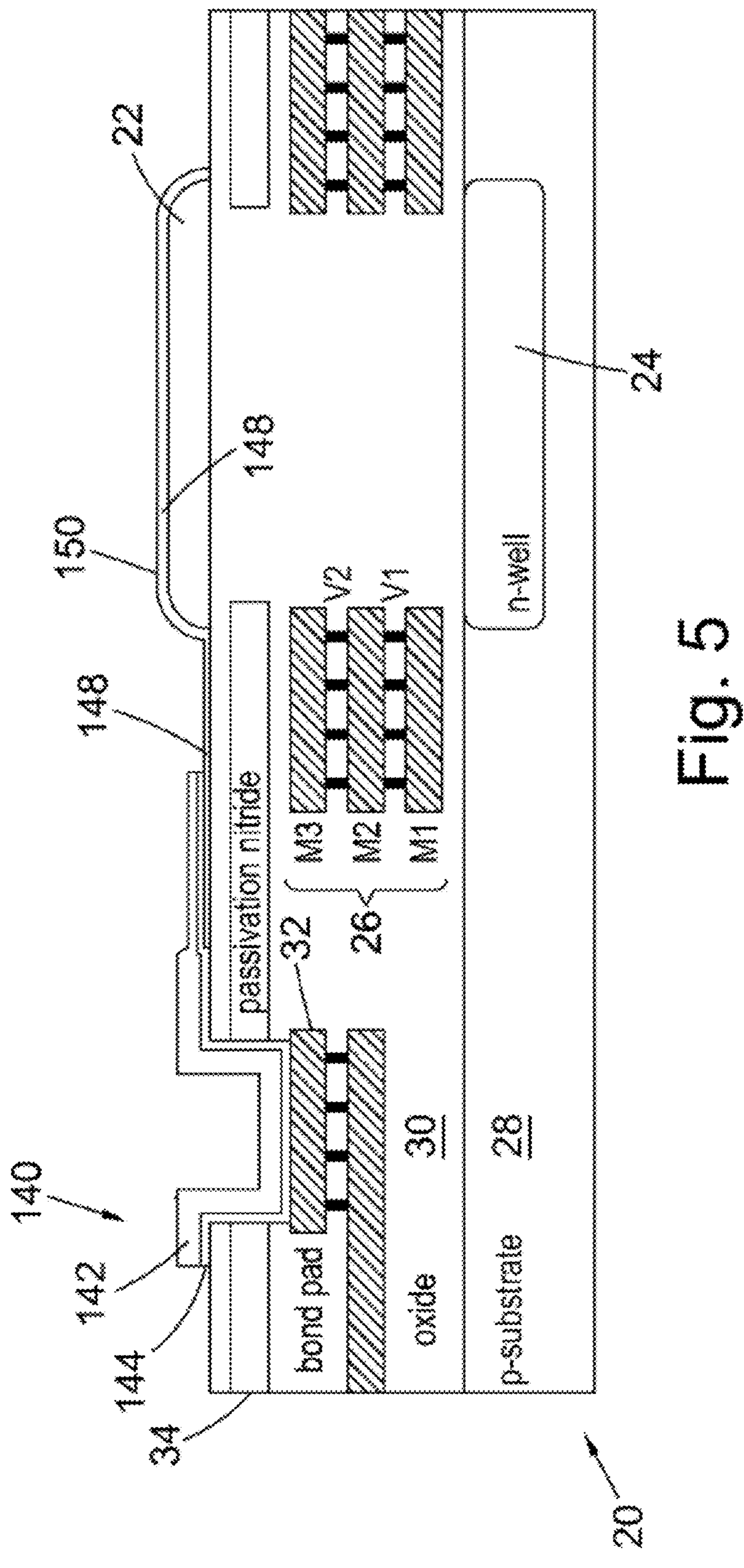
FIG. 5 illustrates a further example of on-chip integration of an ITO thin film having an ohmic contact to a bond pad.

FIG. 5 illustrates an alternative implementation in which the layered stack of electrically conductive materials on the bond pad 32 does not include the ITO layer 46. Instead, a layered stack 140 includes a conductive layer 142 disposed on a sub-stack of at least one diffusion barrier layer or adhesion layer 144 that is disposed on the bond pad 32. The at least one diffusion barrier layer or adhesion layer 144 can be composed, for example, of titanium (Ti). In some implementations, the at least one diffusion barrier layer or adhesion layer 144 includes cobalt, chromium, nickel-chromium, a nickel chromium alloy, molybdenum, and/or titanium sub-oxide. The conductive layer 142 can be composed, for example of aluminum, gold, silver, chromium and/or copper.

In the implementation of FIG. 5, the ITO layer 148 that covers the interference filter 32 is deposited and patterned prior to depositing the layers 144, 142 of the stack 140. The layers 144, 142 of the stack are disposed over the bond pad 32 and extend over the surface of the wafer 20 so that they make electrical contact with the ITO layer 148.

As in the implementation of FIG. 3, the ITO layer 148 can provide both optical and electrical functionality. Thus, in addition to providing an electrical connection to the bond pad 32 via the stack 140 so as to provide electrostatic or RF shielding for the optical filter 22, the ITO layer 148 also can have specified optical properties (e.g., transparency in a particular part of the visible spectrum) to allow electromagnetic radiation in the visible range to pass to the filter 32 for detection by the photodiode 24.

In some instances, the ITO layer 148 is covered with a single- or multilayer anti-reflection coating (ARC) 150 to reduce reflection losses. The ARC 150 also can act as a protective layer for the underlying ITO layer 148.

The foregoing techniques enable the fabrication of ITO layers connected to an electric circuit directly on top of a CMOS device and can enable the on-chip integration of ITO into CMOS processes. The techniques described here can be used, more generally, in connection with any ITO electrode that is formed at least partially on an optical device, and in particular, where the ITO electrode needs to be transparent to wavelength(s) of light that are to be sensed by, or transmitted through, the optical device. Thus, in addition to the examples of an interference filter and an organic IR photodiode discussed above, the techniques can be used in conjunction with optical other devices, such as spectrometers in which a Fraby-Perot interferometer in the form of a piezoelectric element is provided to tune the spectrometer's cavity thickness. Likewise, the techniques can be used on conjunction with electro-optic devices in which a voltage is applied so as to adjust the transparency or opaqueness of device. Further, the foregoing techniques can be used to adjust the polarization state, for example, of liquid crystals.

Various modifications can be made within the spirit of the disclosure. Features described in connection with different embodiments can, in some cases, be combined in the same implementation. Accordingly, other implementations are within the scope of the claims.

The invention claimed is:

1. An apparatus comprising:

an optical device;

an electrically conductive bond pad;

a multi-layer stack of electrically conductive materials on the bond pad, the stack including a first ITO layer as a top layer; and a second ITO layer disposed at least partially on the optical device and on the first ITO layer, wherein the optical device is a photodetector and wherein the second ITO layer covers the photodetector, the apparatus further including:

a second electrically conductive bond pad;

a second multi-layer stack of different electrically conductive materials on the second electrically conductive bond pad, the second stack including a top layer comprising a first ITO layer;

an electrode layer disposed on a side of the optical device opposite that of the second ITO layer and connected to the first ITO layer of the second stack.

2. The apparatus of claim 1 wherein the first ITO layer has a composition that differs from that of the second ITO layer.

3. The apparatus of claim 1 wherein the second ITO layer covers the optical device.

4. The apparatus of claim 1 wherein the multi-layer stack of electrically conductive materials forms an ohmic contact to the bond pad.

5. The apparatus of claim 1 wherein the multi-layer stack of electrically conductive materials includes a conductive layer in direct contact with the bond pad, and a sub-stack of at least one diffusion barrier layer or adhesion layer is in direct contact with the conductive layer, wherein the first ITO layer is in direct contact with the sub-stack of at least one diffusion barrier layer or adhesion layer.

6. The apparatus of claim 1 wherein the multi-layer stack comprises a titanium layer on an aluminum layer that is in direct contact with the bond pad, wherein the first ITO layer is on the titanium layer.

7. The apparatus of claim 1, wherein the optical device is an optical interference filter.

8. The apparatus of claim 7, wherein the optical interference filter is disposed over a light detecting element in an integrated semiconductor circuit.

9. The apparatus of claim 1, wherein the electrode layer disposed on a side of the optical device opposite that of the second ITO layer is composed of a third ITO layer.

10. The apparatus of claim 1 wherein the first and second ITO layers are integrated as part of a CMOS integrated circuit.

* * * * *